(12) United States Patent
Jang et al.

(10) Patent No.: US 7,652,367 B2
(45) Date of Patent: Jan. 26, 2010

(54) SEMICONDUCTOR PACKAGE ON PACKAGE HAVING PLUG-SOCKET TYPE WIRE CONNECTION BETWEEN PACKAGES

(75) Inventors: Kyung-Lae Jang, Yongin-si (KR); Kwon-Young Roh, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 9 days.

(21) Appl. No.: 11/959,557

(22) Filed: Dec. 19, 2007

(65) Prior Publication Data

US 2008/0150116 A1 Jun. 26, 2008

(30) Foreign Application Priority Data

Dec. 22, 2006 (KR) .................. 10-2006-0133153

(51) Int. Cl.
*H01L 23/48* (2006.01)
(52) U.S. Cl. .................. 257/696; 257/E23.01
(58) Field of Classification Search ............ 257/684, 257/686, 692, 696, 697, 698, 693, E23.01; 438/106; 439/66, 74, 620.15, 620.2
See application file for complete search history.

(56) References Cited

U.S. PATENT DOCUMENTS

| | | | |
|---|---|---|---|
| 5,648,683 A | * | 7/1997 | Takahashi ............ 257/685 |
| 6,501,663 B1 | | 12/2002 | Pan |
| 2005/0042899 A1 | * | 2/2005 | Zhang ............ 439/74 |

FOREIGN PATENT DOCUMENTS

| | | |
|---|---|---|
| JP | 2004-015017 | 1/2004 |
| JP | 2004-228142 | 8/2004 |
| KR | 1020010068614 A | 7/2001 |
| KR | 1020040059744 A | 7/2004 |

\* cited by examiner

*Primary Examiner*—Zandra Smith
*Assistant Examiner*—Jamie Niesz
(74) *Attorney, Agent, or Firm*—F.Chau & Associates, LLC

(57) ABSTRACT

A semiconductor package on package includes a tower package, an upper package stacked over the lower package, a plug wire combined to any one of an upper portion of the tower package and a lower portion of the upper package, and a socket wire combined to any one of the upper portion of the lower package and the lower portion of the upper package. The plug wire is plugged into the socket wire to electrically connect the upper and lower packages.

7 Claims, 6 Drawing Sheets

SEMICONDUCTOR PACKAGE ON PACKAGE HAVING PLUG-SOCKET TYPE WIRE CONNECTION BETWEEN PACKAGES

CROSS-REFERENCE TO RELATED PATENT APPLICATION

This application claims priority under 35 U.S.C. §119 from Korean Patent Application No. 10-2006-0133153, filed on Dec. 22, 2006, the disclosure of which is hereby incorporated by reference herein as if set forth in its entirety.

BACKGROUND OF THE INVENTION

1. Technical Field

The present disclosure relates to a semiconductor package and, more particularly, to a semiconductor package on package having a plug-socket type wire connection.

2. Discussion of Related Art

As the technology in the electronic industry field develops, electronic parts become highly functional and compact. To keep pace with the development, a package on package (POP) technology to stack an upper package on a tower package has been developed as a package fabrication method to realize a high density package and a semiconductor package on package technology to mount a plurality of integrated circuits on a single substrate. The POP, which is increasingly used for an application processor (AP) and media, structurally includes an upper package, a tower package, and a connection unit connecting the upper package and the lower package.

FIG. 1 shows a front elevation of a general semiconductor POP 100. Referring to FIG. 1, the semiconductor POP 100 includes an upper package 10 and a lower package 20. In general, the upper package 10 includes a plurality of memory chips 12, a first printed circuit board (PCB) 14, a plurality of first connection wires 16, a first molding area 18, and a plurality of first balls 19, for example, solder balls.

The memory chips 12 are deposited on the first PCB 14. The first connection wires 16 connect the memory chips 12 and the first PCB 14. The first molding area 18 covers and protects the memory chips 12 and the first PCB 14 with an epoxy molding compound (EMC).

The first balls 19 are located under the first PCB 14 and electrically connect the upper and lower packages 10 and 20 by being combined with a ball land (not shown) formed on the upper surface of the lower package 20. In general, the lower package 20 includes a logic device 22, a second PCB 24, a plurality of second connection wires 26, a second molding area 28, and a plurality of second balls 29, for example, solder balls.

The logic device 22 is located at the center of the second PCB 24. The second molding area 28 covers and protects the logic device 22 with EMC. The second connection wires 26 connect the logic device 22 and the second PCB 24. The plurality of second balls 29 are formed on the lower surface of the second PCB 24 and electrically connect the POP 100 to a motherboard (not shown), and the POP 100 is mechanically installed on the motherboard.

As described above, the second molding area 26 covering the logic device 22 exists at the center of the lower package 20 of the POP 100. Accordingly, the solder balls cannot be arranged in an area of the upper package 10 of the POP 100 corresponding to the second molding area of the lower package 20.

Thus, as the capacity of memory chips included in the upper package 10 increases, the number of interconnections between the upper and lower packages 10 and 20 increases The number of solder balls arranged in the upper package 10, however, is limited by the structure of the lower package 20. Also, the conventional POP 100 has a problem regarding the solder ball reliability of the contact of the solder balls between the upper and lower packages 10 and 20.

The thermal expansion coefficients of the first PCB 14, the first solder balls 19 located at the lower surface of the first PCB 14, and the second PCB 24 including the ball land (not shown) that the first solder balls 19 contact are different from one another. Thus, when the lower package 20 installed on the motherboard is stressed, because the thermal expansion coefficients of the first PCB 14, the first solder balls 19, and the second PCB 24 are different from one another, cracks may be generated in the first solder balls 19, which causes defects in the end products, for example, a motherboard or a memory module.

Therefore, there is a demand for the structure of a connector connecting the upper and lower packages of the POP that can increase the number of interconnections of the POP and reduce an adverse effect from the motherboard caused by stress.

SUMMARY OF THE INVENTION

To solve the above and/or other problems, exemplary embodiments of the present invention provide a POP having a connector connecting upper and lower packages that can increase the number of interconnections between the upper and lower packages and that can reduce the influence of stress from a motherboard.

According to an exemplary embodiment of the present invention, a semiconductor package on package comprises a lower package, an upper package stacked over the lower package, and a plurality of conductive wire connectors, each of the conductive wire connectors electrically connecting the upper package and the lower package and having a wire connection of a plug-socket type shape.

Each of the conductive wire connectors comprises a plug wire combined to one of an upper portion of the lower package and a lower portion of the upper package, and a socket wire combined to the other of the upper portion of the lower package and the lower portion of the upper package, wherein the plug wire is plugged in the socket wire. The plug wire is detachable from the socket wire.

Both end points of the plug wire are combined to any one of the upper portion of the lower package and the lower portion of the upper package and the plug wire has at least one apex. The plug wire has a thickness that is different from that of the socket wire.

The socket wire comprises a first wire and a second wire, each of the first and second wires having both end points combined to any one of the upper portion of the lower package and the lower portion of the upper package and having at least one apex, wherein the first and second wires have an interval therebetween, such that the plug wire can be plugged in between the first wire and the second wire, and the interval at one end between the first wire and the second wire is different from the interval at the other end between the first wire and the second wire.

According to an exemplary embodiment of the present invention, a package on package semiconductor device includes a first package and a second package stacked over the first package, wherein the first package comprises a first PCB, a plurality of memory chips stacked on the first PCB and electrically connected to the first PCB, a first molding area covering the memory chips and the first PCB, and a first wire electrically combined to one area of a tower portion of the first PCB, and the second package comprises a second PCB, a logic device combined to one area on the second PCB, a second molding area covering the logic device and combined to the other area of a lower portion of the first PCB to support the first package, and a second wire combined to the other area on the second PCB, and the first wire and the second wire have a plug-socket type connection that is detachable.

The first wire has one of a plug shape and a socket shape, the second wire has the other of the plug shape and the socket shape, and the first wire and the second wire are plugged into each other. The first wire has a thickness different from that of the second wire.

Both end points of the first wire are combined to one area of a lower portion of the first PCB and the first wire has at least one apex, the second wire includes a third wire and a fourth wire, both end points of each of the third and fourth wires are combined to the other area on the second PCB and each of the third and fourth wires has at least one apex and the third and fourth wires have an interval such that the first wire is plugged in between the third and fourth wires and an interval at one end between the third and fourth wires is different from an interval at the other end between the third and fourth wires.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
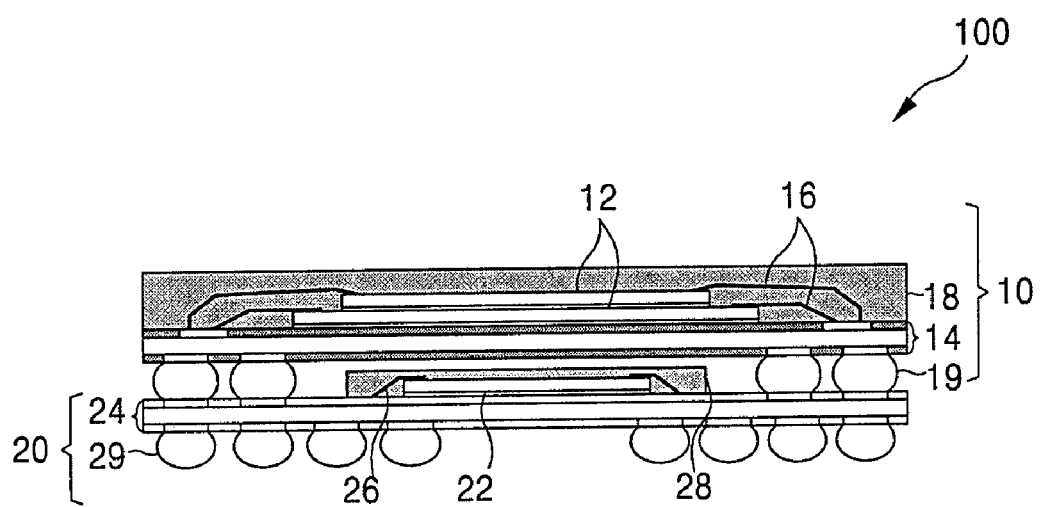
FIG. 1 shows a front view of a general semiconductor POP.

The attached drawings for illustrating exemplary embodiments of the present invention are referred to in order to gain a sufficient understanding of the present invention, the merits thereof and the objectives accomplished by the implementation of the present invention. Hereinafter, the present invention will be described in detail by explaining exemplary embodiments of the invention with reference to the attached drawings. Like reference numerals in the drawings denote like elements.

Figure 2:
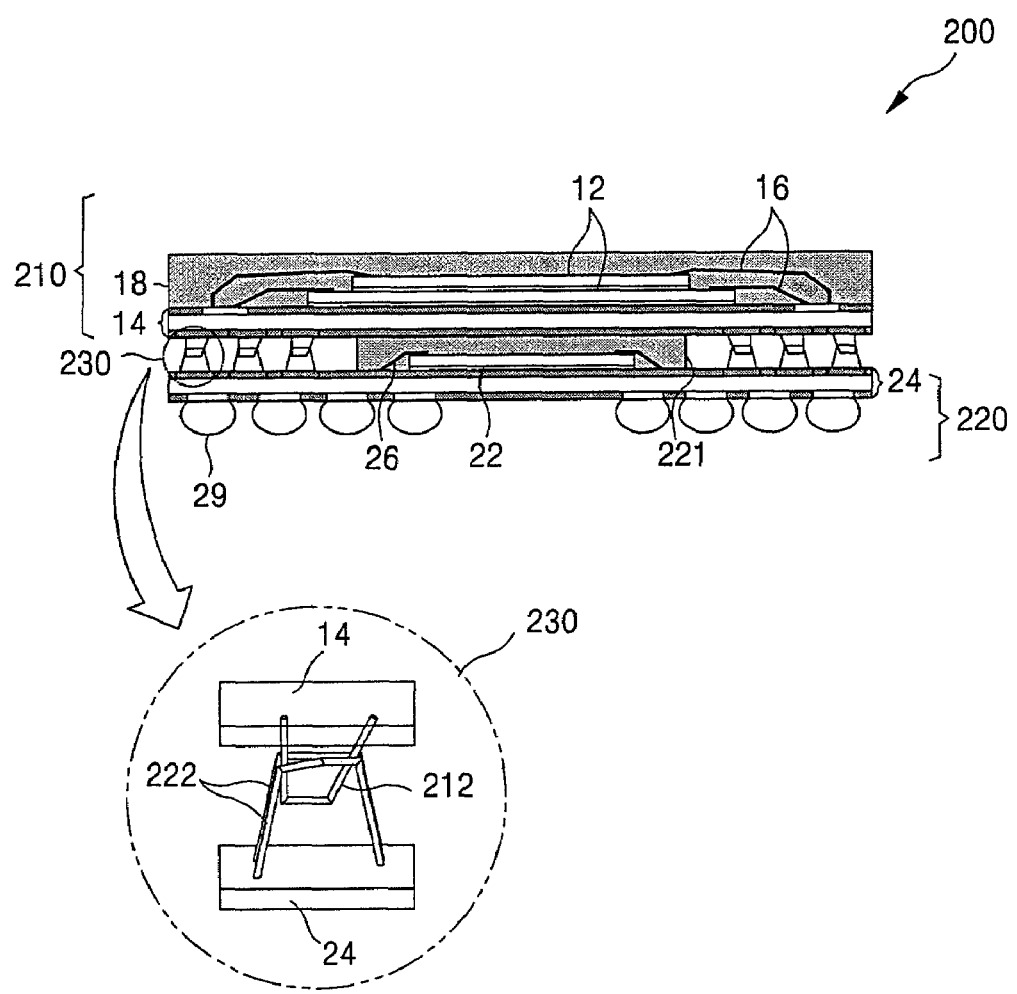
FIG. 2 shows a front view of a semiconductor POP including a wire-type connector according to an exemplary embodiment of the present invention.

FIG. 2 shows a front elevation of a semiconductor package on package (POP) including a wire-type connector according to an exemplary embodiment of the present invention. Referring to FIG. 2, a semiconductor POP 200 includes an upper package 210 and a lower package 220. The upper package 210 includes the memory chips 12, the first printed circuit board (PCB) 14, the first connection wires 16, the first molding area 18, and a plurality of plug wires 212.

The memory chips 12 are stacked on the first PCB 14 and electrically connected to the first PCB 14 by the first connection wires 16. The first molding area 18 covers the memory chips 12 and the first PCB 14 to protect the upper package 210. Each of the plug wires 212 can be combined or connected to one of the lower portion of the upper package 210 and the upper portion of the lower package 220. For example, each of the plug wires 212 can be electrically combined or connected to an area of the lower portion of the first PCB 14.

The lower package 220 includes the logic device 22, the second PCB 24, a plurality of second connection wires 26, a second molding area 221, a plurality of socket wires 222, and a plurality of balls 29, for example, solder balls. The logic device 22 is located at an area on the second PCB 24.

The second molding area 221 covers and protects the logic device 22. The second molding area 221 improves a characteristic of the combination of the upper package 210 and the lower package 220 having a stack structure and is combined to the other area of the lower portion of the first PCB 14 to support the upper package 210.

Each of the socket wires 222 can be combined with the other of the lower portion of the upper package 210 and the upper portion of the lower package 220. For example, each of the socket wires 222 can be combined to the other area on the second PCB 24. One of the plug wires 212 is formed to plug into a corresponding socket wire of the socket wires (222). One of the plug wires 212 is formed to detachably plug in one of the socket wires 222 corresponding to the plug wire.

The plug wire 212 can be formed to have a thickness different from the corresponding socket wire 222. Any one of the plug wires 212 and any one of the socket wires 222 can electrically connect the upper and lower packages 210 and 220.

An interconnector, for example, 212 combined with 222, having the plug wires 212 and socket wires 222 of the POP 200 takes a space smaller than the conventional interconnector, for example, the first solder balls 19 shown in FIG. 1. Thus, the POP 200 according to an exemplary embodiment can increase the number of interconnectors compared to the conventional technology. The POP 200 is installed on a mother-board (not shown) through the second solder balls 29. The lower package 220 is stressed by the motherboard through the second solder balls 29.

In the conventional POP 100 using the solder ball connector, cracks can be generated in the solder balls 29 when the POP 100 is stressed. The POP 200 using the wire connector having a plug-socket type structure according to the exemplary embodiment can buffer a difference in the stress between the first PCB 14 and the second PCB 24, that is, can prevent cracks that may be generated in the connector connecting the first PCB 14 and the second PCB 24 due to a difference in thermal expansion coefficients.

Figure 3:
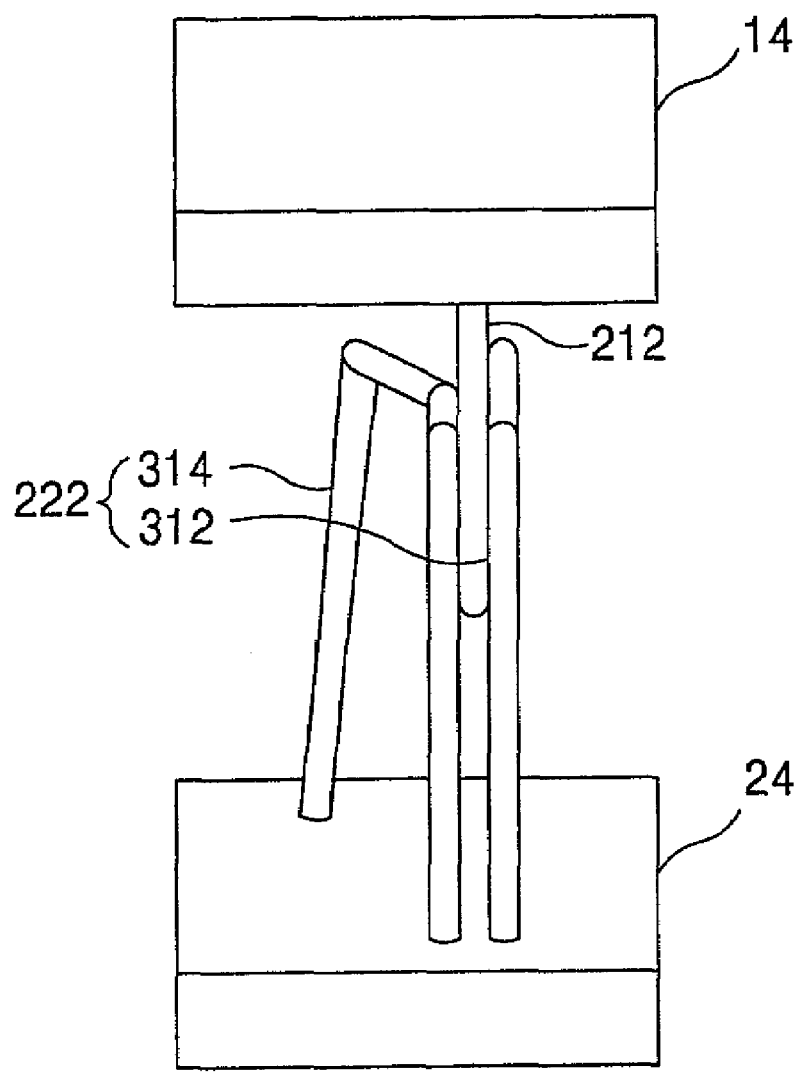
FIG. 3 shows a front perspective view of the plug wire and socket wire of the device shown In FIG. 2.
Figure 4:
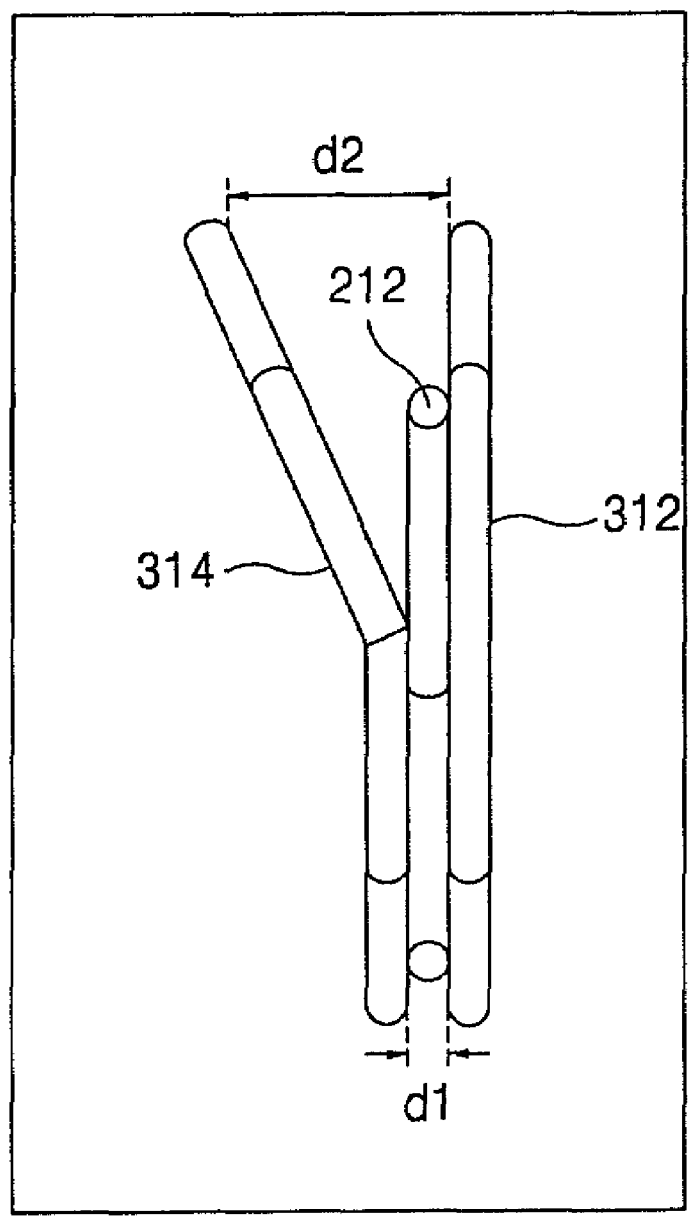
FIG. 4 shows a plan view of the plug wire and socket wire of the device shown in FIG. 2.
Figure 5:
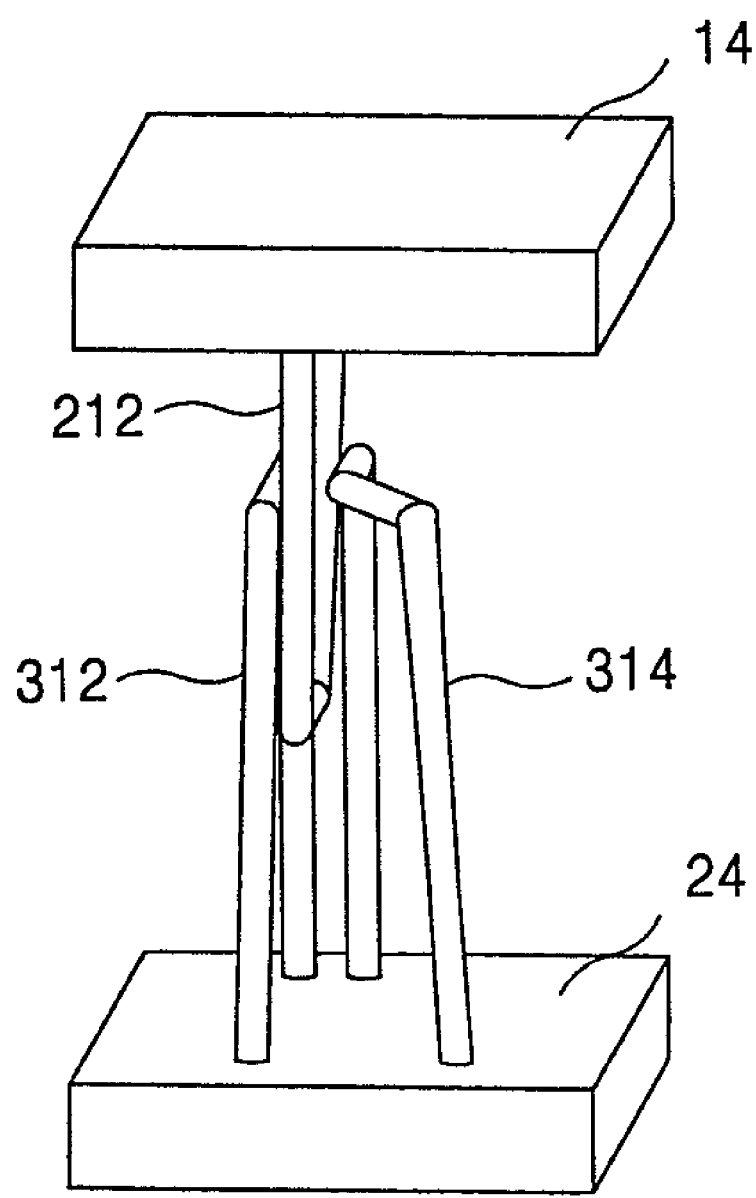
FIG. 5 shows a rear perspective view of the plug wire and socket wire of the device shown in FIG. 2.
Figure 6:
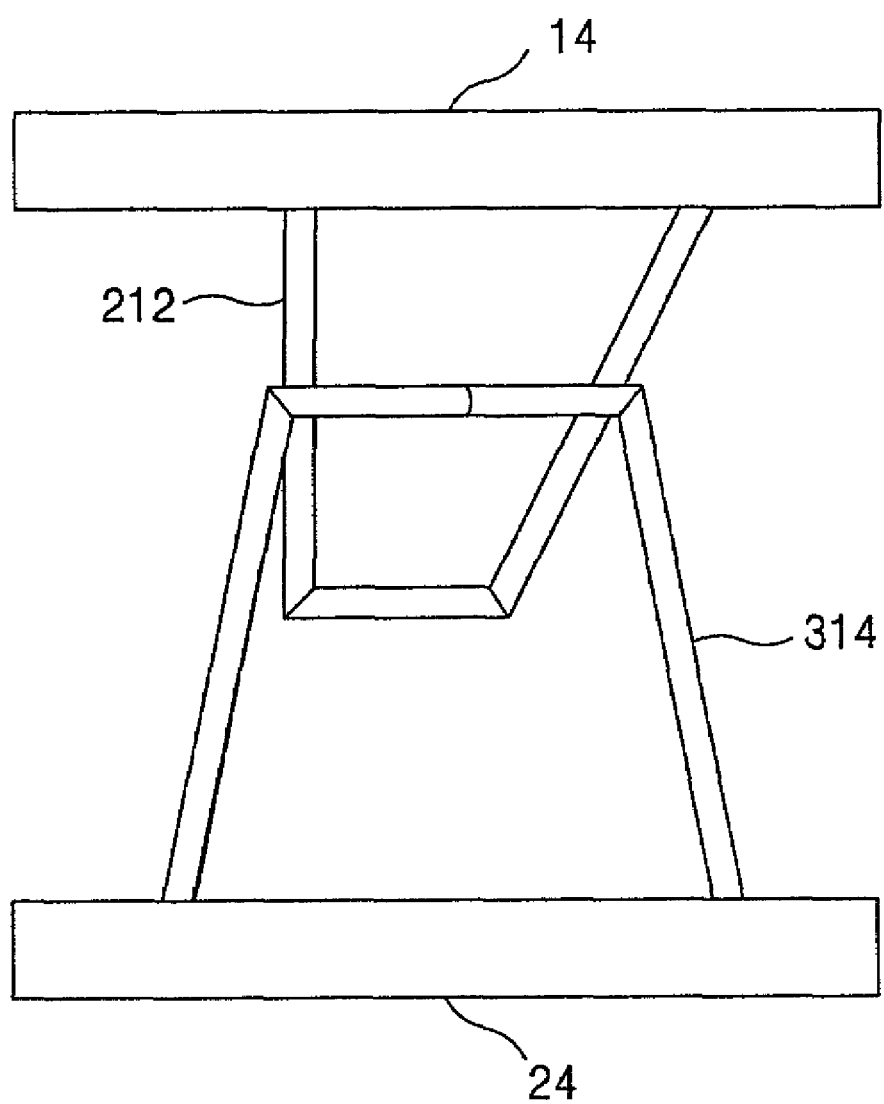
FIG. 6 shows a side view of the plug wire and socket wire of the device shown in FIG. 2.

FIG. 3 shows a front perspective view of the plug wire and socket wire of FIG. 2, and FIG. 4 is a plan view of the plug wire and socket wire of FIG. 2. FIG. 5 is a rear perspective view of the plug wire and socket wire of FIG. 2: and FIG. 6 is a side view of the plug wire and socket wire of FIG. 2.

Referring to FIGS. 3 through 6, both end points of one of the plug wires 212 are combined with one of the upper portion of the lower package 220, for example, the second PCB 24, and the lower portion of the upper package 210, for example, the first PCB 14. The plug wire 212 is shaped to have at least one apex to form, for example, a trapezoid.

Each of the socket wires 222 includes a first wire 312 and a second wire 314. Both end points of each of the first and second wires 312 and 314 are combined or connected to the other of the upper portion of the lower package 220, for example, the second PCB 24, and a lower portion of the upper package 210, for example, the first PCB 14. Each of the first and second wires 312 and 314 can be formed to have at least one apex.

As shown in FIG. 4, the first and second wires 312 and 314 are formed having an interval d1 such that the plug wire 212 can be plugged in between the first wire 312 and the second wire 314.

The plug wire 212 is plugged in between the first and second wires 312 and 314. As the plug wire 212 is inserted between the first and second wires 312 and 314, the upper and lower packages 210 and 220 are electrically connected to each other. Thus, since the plug wire 212 is plugged in between the socket wires 312 and 314, the POP 200 according to the exemplary embodiment can reduce the height of the POP compared to the conventional technology.

The first and second wires 312 and 314 are formed such that the interval d1 at one end between the first and second wires 312 and 314 can be different from an interval d2 at the other end between the first and second wires 312 and 314 (d1≠d2). For example, the first wire 312 can have a trapezoidal shape while the second wire 314 can have a trapezoidal shape bent outside from the first wire 312, as shown in FIG. 4. This is to have the plug wire 212 easily inserted between the first and second wires 312 and 314.

As described above, the semiconductor POP according to an exemplary embodiment of the present invention uses the connector having a plug-socket type wire structure, so that the number of interconnections between the upper and lower packages can be increased. Also, the semiconductor POP according to an exemplary embodiment of the present invention can prevent the generation of cracks in the connector due to the stress from the motherboard and reduce the height of the POP.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A semiconductor package on package comprising:
   a lower package;
   an upper package stacked over the lower package; and
   a plurality of conductive wire connectors, each of the conductive wire connectors electrically connecting the upper package and the tower package and having a wire connection of a plug-socket shape,
   wherein each of the conductive wire connectors comprises:
   a plug wire combined to one of an upper portion of the lower package and a lower portion of the upper package; and
   a socket wire combined to the other of the upper portion of the lower package and the lower portion of the upper package,
   wherein the plug wire is plugged in the socket wire, and
   wherein the socket wire comprises a first wire and a second wire, each of the first and second wires having both end points combined to any one of the upper portion of the lower package and the lower portion of the upper package and having at least one apex,
   wherein the first and second wires have an interval therebetween such that the plug wire can be plugged in between the first wire and the second wire, and the interval at one end between the first wire and the second wire is different from the interval at the other end between the first wire and the second wire.

2. The semiconductor package on package of claim 1, wherein the plug wire is detachable from the connection with the socket wire.

3. The semiconductor package on package of claim 1, wherein both end points of the plug wire are combined to any one of the upper portion of the lower package and the lower portion of the upper package and the plug wire has at least one apex.

4. The semiconductor package on package of claim 3, wherein the plug wire has a thickness different from a thickness of the socket wire.

5. A package on package semiconductor device including a first package and a second package stacked over the first package, wherein the first package comprises:
   a first printed circuit board (PCB);
   a plurality of memory chips stacked on the first PCB and electrically connected to the first PCB;
   a first molding area covering the plurality of memory chips and the first PCB; and
   a first wire electrically combined to one area of a lower portion of the first PCB, and wherein the second package comprises:
   a second PCB;
   a logic device located on one area on the second PCB;
   a second molding area covering the logic device and combined to the other area of a lower portion of the first PCB to support the first package; and
   a second wire combined to the other area on the second PCB, and
   the first wire and the second wire have a plug-socket connection that is detachable,
   wherein both end points of the first wire are combined to one area of a lower portion of the first PCB and the first wire has at least one apex, the second wire includes a third wire and a fourth wire, both end points of each of the third and fourth wires are combined to the other area on the second PCB and each of the third and fourth wires has at least one apex, and the third and fourth wires have an interval suck that the first wire is plugged in between the third and fourth wires and an interval at one end between the third and fourth wires is different from an interval at the other end between the third and fourth wires.

6. The package on package semiconductor device of claim 5, wherein the first wire has one of a plug shape and a socket shape, the second wire has the other of the plug shape and the socket shape, and the first wire and the second wire are plugged into each other.

7. The package on package semiconductor device of claim 6, wherein the first wire has a thickness different from a thickness of the second wire.

* * * * *